(12) United States Patent
Chiang et al.

(10) Patent No.: US 8,125,008 B2
(45) Date of Patent: Feb. 28, 2012

(54) SCHOTTKY DEVICE AND PROCESS OF MAKING THE SAME COMPRISING A GEOMETRY GAP

(75) Inventors: Chiu-Chih Chiang, Hsinchu (TW); Chih-Feng Huang, Zhubei (TW); You-Kuo Wu, Sijhih (TW); Long Shih Lin, Jhubei (TW)

(73) Assignee: System General Corporation, Taipei (TW)

( * ) Notice: Subject to any disclaimer, the term of this patent is extended or adjusted under 35 U.S.C. 154(b) by 442 days.

(21) Appl. No.: 11/601,131

(22) Filed: Nov. 17, 2006

(65) Prior Publication Data

US 2008/0116539 A1 May 22, 2008

(51) Int. Cl.
*H01L 29/66* (2006.01)

(52) U.S. Cl. ........ 257/281; 257/155; 257/475; 257/478; 257/481; 257/483; 257/E27.068; 257/E31.065; 257/E31.066; 257/E31.074; 257/E33.051; 257/E51.009

(58) Field of Classification Search ............... 257/281, 257/481, 475, 478, 483, 155, E51.009, E33.051, 257/E31.065, E31.066, E31.074, E27.068
See application file for complete search history.

(56) References Cited

U.S. PATENT DOCUMENTS

| | | | |
|---|---|---|---|
| 4,333,100 A * | 6/1982 | Morcom et al. | 257/479 |
| 4,845,534 A * | 7/1989 | Fukuta | 257/283 |
| 5,061,981 A | 10/1991 | Hall | |
| 5,072,268 A * | 12/1991 | Rumennik | 257/378 |
| 5,296,406 A * | 3/1994 | Readdie et al. | 438/570 |
| 5,438,217 A * | 8/1995 | Ishaque et al. | 257/438 |
| 5,532,507 A * | 7/1996 | Wada | 257/280 |
| 5,536,666 A * | 7/1996 | Miller et al. | 438/179 |
| 6,392,275 B1 * | 5/2002 | Jang | 257/343 |
| 2003/0034531 A1 * | 2/2003 | Kanda et al. | 257/392 |

FOREIGN PATENT DOCUMENTS

JP 62-46571 A 2/1987

OTHER PUBLICATIONS

ICKnowledge.com.*
Electron Spin Resonance in Mechanically Fractured Silicon Carbide Crystals by M.V. Vlasova, N.G. Kakazei, B.M. Kipnis, and I. A. Khint, Copy Right 1982 by Plenum Publishing Coporation vol. 35, No. 3, p. 1005-1007.*
Taiwan Intellectual Property Office Action for Taiwan Patent Application No. 096114664 (May 6, 2010).

* cited by examiner

*Primary Examiner* — Matthew E Warren
*Assistant Examiner* — David Chen
(74) *Attorney, Agent, or Firm* — Skaar Ulbrich Macari, P.A.

(57) ABSTRACT

A Schottky device and a semiconductor process of making the same are provided. The Schottky device comprises a substrate, a deep well, a Schottky contact, and an Ohmic contact. The substrate is doped with a first type of ions. The deep well is doped with a second type of ions, and formed in the substrate. The Schottky contact contacts a first electrode with the deep well. The Ohmic contact contacts a second electrode with a heavily doped region with the second type of ions in the deep well. Wherein the deep well has a geometry gap with a width formed under the Schottky contact, the first type of ions and the second type of ions are complementary, and the width of the gap adjusts the breakdown voltage.

10 Claims, 6 Drawing Sheets

SCHOTTKY DEVICE AND PROCESS OF MAKING THE SAME COMPRISING A GEOMETRY GAP

CROSS-REFERENCES TO RELATED APPLICATIONS

Not applicable.

BACKGROUND OF THE INVENTION

1. Field of the Invention

The present invention relates to a Schottky device and a semiconductor process of making the same; more specifically, relates to a semiconductor process of fabricating a Schottky device with a high breakdown voltage.

2. Descriptions of the Related Art

Schottky devices are widely used in many semiconductor circuits. Referring to FIG. 1 and FIG. 2, FIG. 1 is a top view of a Schottky device 1 of the prior art, and FIG. 2 is a side elevational, cross-sectional view of the portion of the Schottky device 1 of FIG. 1 taken substantially along section line A-A thereof. The Schottky device 1 comprises a P-substrate 101, a deep N-well 103, a heavily doped region 105 being doped with an n-type of ions, a Schottky contact 107, an Ohmic contact 109, a doped region 111 being doped with a p-type of ions, a Schottky electrode 113, and an Ohmic electrode 115. The Schottky contact 107 contacts the Schottky electrode 113 with the deep N-well 103. The Ohmic contact 109 contacts the Ohmic electrode 115 with the heavily doped region 105. The doped region 111 that is adjacent to the deep N-well 103 will ensure a breakdown voltage of the Schottky devices 1 on a fixed value.

However, an ion concentration of the deep N-well 103 will be reduced for improving the breakdown voltage of the Schottky devices 1. Therefore, there are extra masks and processes needed to fabricate the Schottky devices 1, and costs will be increased. Furthermore, a conductive resistance of the Schottky devices 1 will increase substantially.

According to the above description, there is a need in this industry to improve a high breakdown voltage of a Schottky device without extra masks and processes.

SUMMARY OF THE INVENTION

One object of this invention is to provide a Schottky device with a breakdown voltage. The Schottky device comprises a substrate, a deep well, a Schottky contact, and an Ohmic contact. The substrate is doped with a first type of ions. The deep well is doped with a second type of ions, and formed in the substrate. The Schottky contact contacts a first electrode with the deep well. The Ohmic contact contacts a second electrode with a heavily doped region with the first type of ions in the deep well. The deep well has a geometry gap with a width formed under the Schottky contact, the first type of ions and the second type of ions are complementary, and the width of the gap is configured to adjust the breakdown voltage.

Another object of this invention is to provide a semiconductor process for forming a Schottky device. The semiconductor process comprises the steps of forming a deep well with a second type of ions in a substrate with a first type of ions; forming a first doped region with the first type of ions; forming an oxide layer; forming a second doped region in the deep well with the first type of ions; forming a heavily doped region in the deep well with the second type of ions; and forming a first electrode on a Schottky contact on the deep well and a second electrode on an Ohmic contact on the second heavily doped region. The first type of ions and the second type of ions are complementary, the doped region and the deep well are separated, the first heavily doped region is around the first electrode, and the deep well has a geometry gap with a width formed under the Schottky contact.

The present invention provides a geometry gap with a width that is formed under a Schottky contact of a Schottky device. And the width is configured to adjust the breakdown voltage. In addition, extra masks and processes are not needed, and costs can be reduced. Also, a conductive resistance of the Schottky device will be also reduced.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
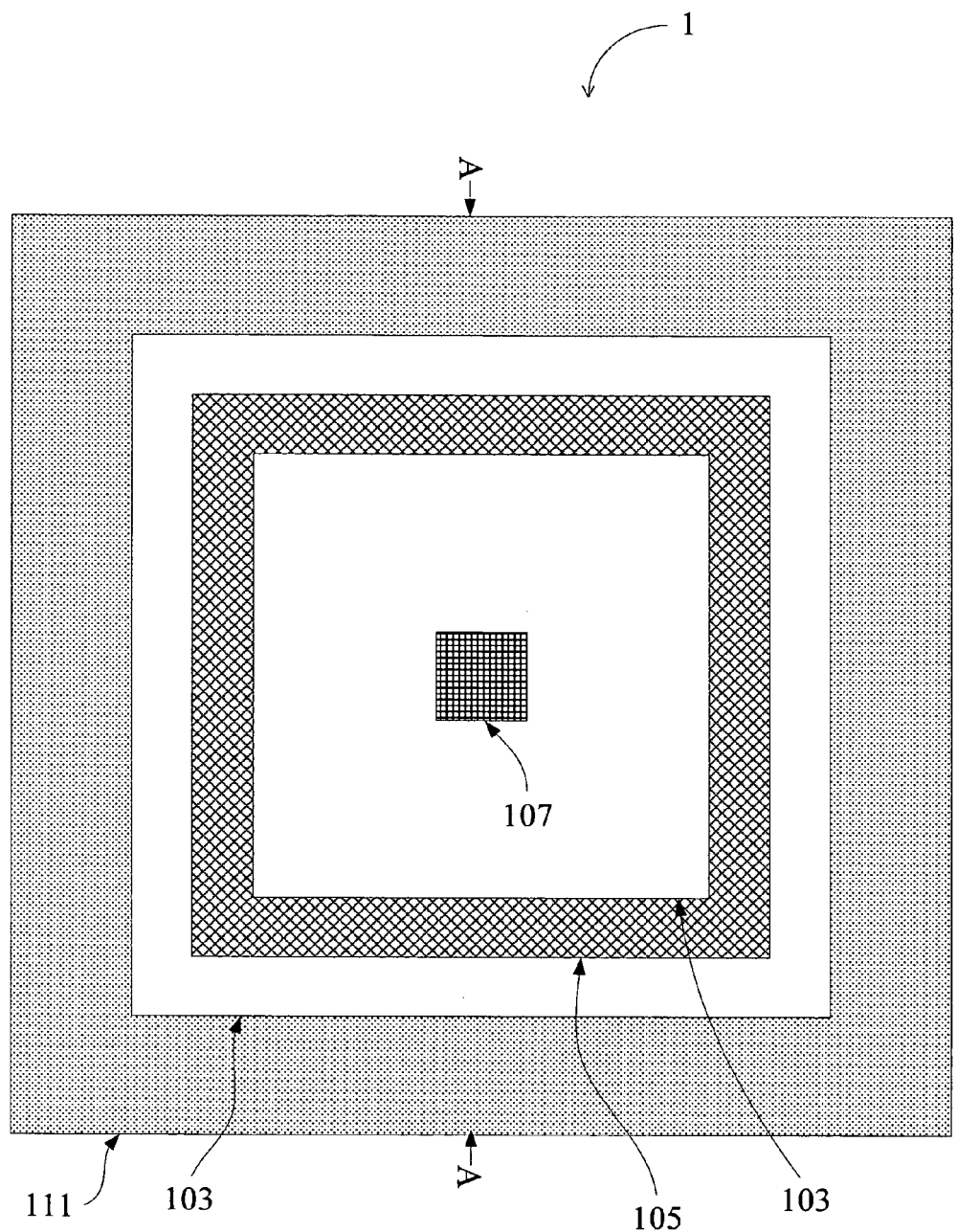
FIG. 1 illustrates a top view of a Schottky device of the prior art.
Figure 2:
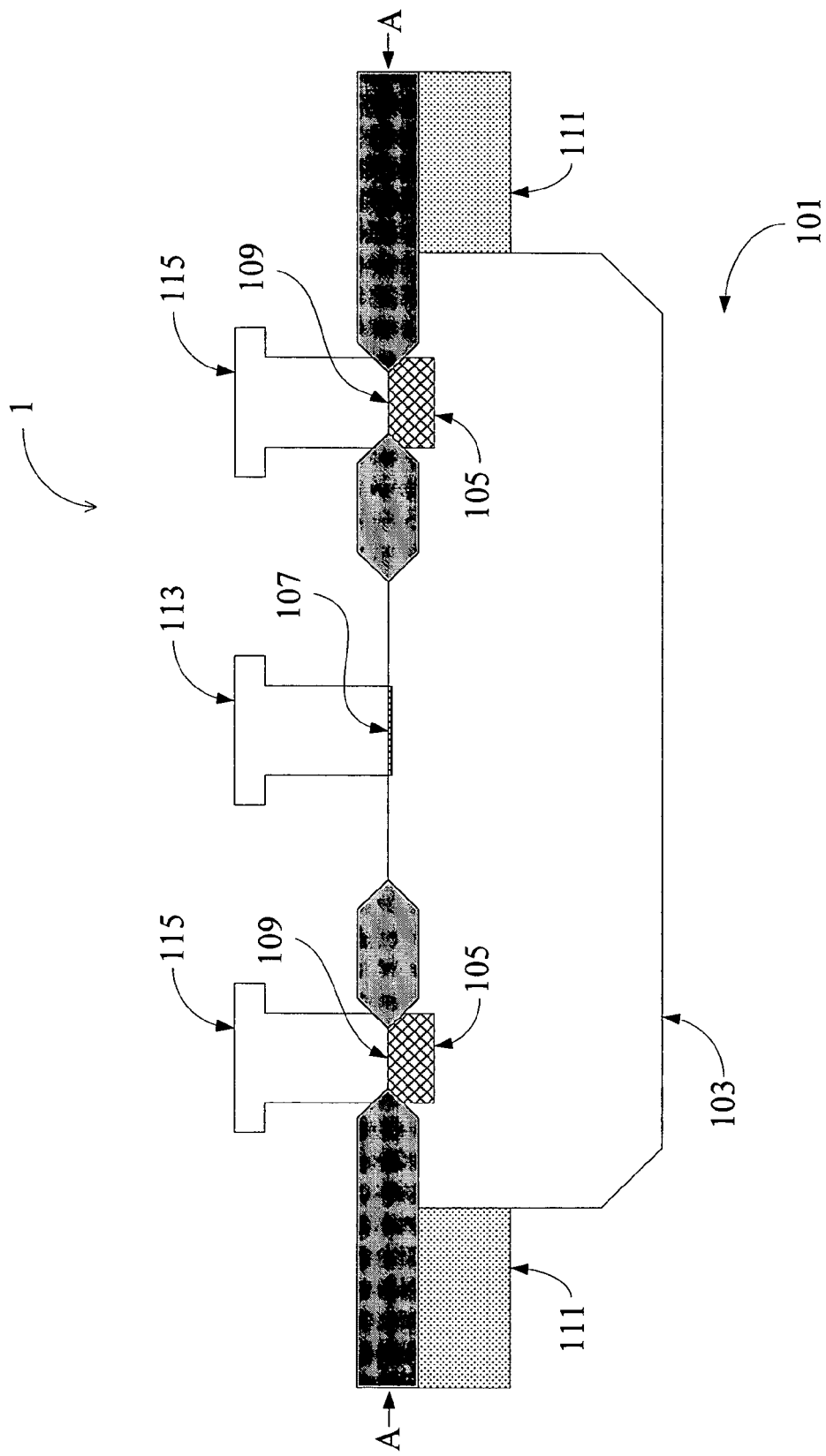
FIG. 2 illustrates a cross-section view of the Schottky device of the prior art.
Figure 3:
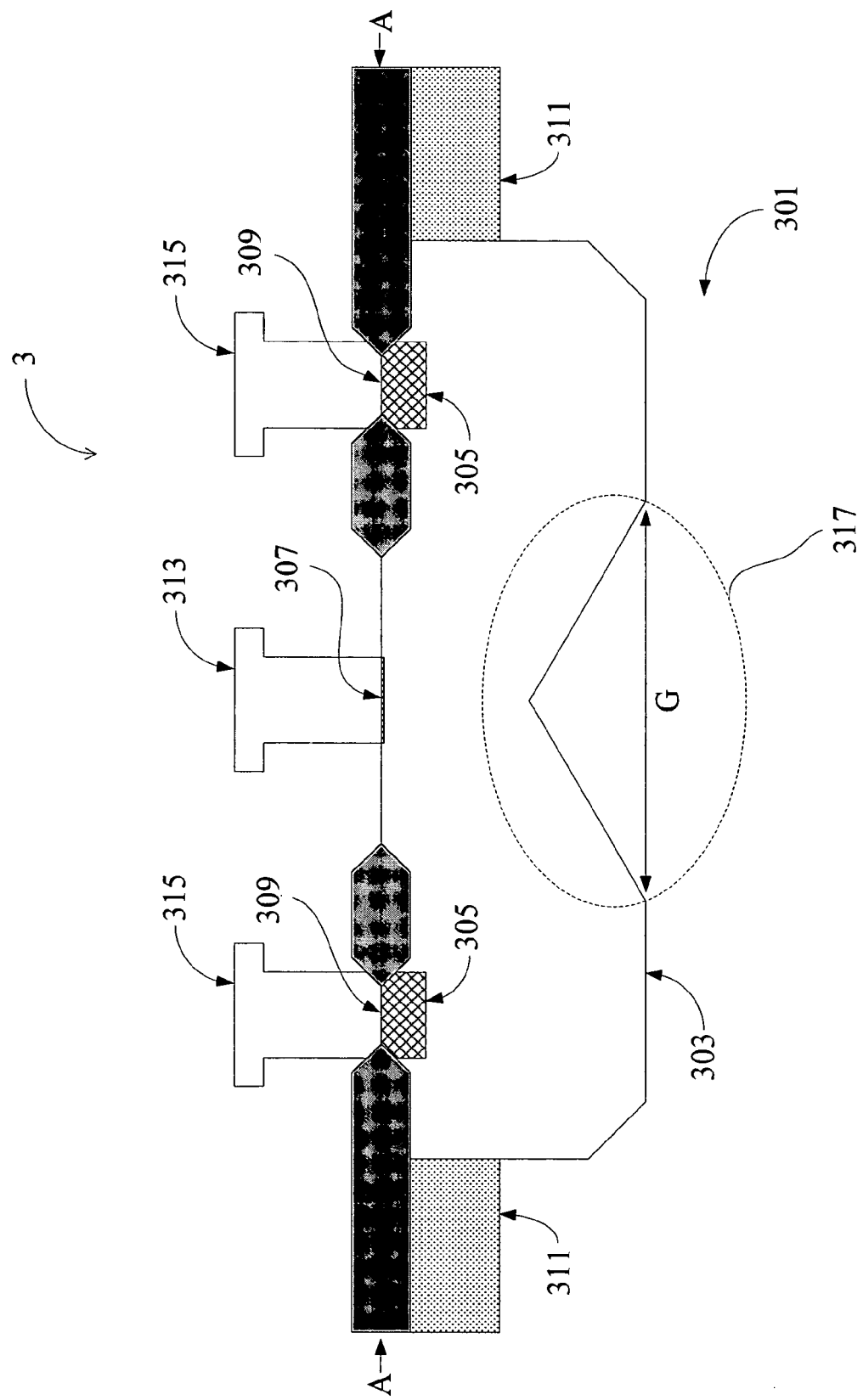
FIG. 3 illustrates a cross-section view of the first embodiment of the present invention.

A side elevational, cross-sectional view of a Schottky device 3 of a first embodiment of the present invention is illustrated in FIG. 3. Since a top view of the Schottky device 3 is just like the one illustrated in FIG. 1, FIG. 3 is taken substantially along section line A-A of FIG. 1. The first embodiment comprises a P-substrate 301, a deep N-well 303, a heavily doped region 305, a Schottky contact 307, an Ohmic contact 309, a doped region 311, a Schottky electrode 313, and an Ohmic electrode 315.

According to the first embodiment, the P-substrate 301 is doped with a p-type of ions. The deep N-well 303 is doped with an n-type of ions, and formed in the P-substrate 301. The heavily doped region 305 is heavily doped with the n-type of ions, and formed in the deep N-well 303. The Schottky contact 307 contacts the Schottky electrode 313 with the deep N-well 303. The Ohmic contact 309 contacts the Ohmic electrode 315 with the heavily doped region 305. And the deep N-well 303 further has a geometry gap formed in a geometry gap region 317 with a width G. The geometry gap region 317 is formed under the Schottky contact 307, and a breakdown voltage of the Schottky device 3 can be adjusted by configuring the width G.

Figure 4:
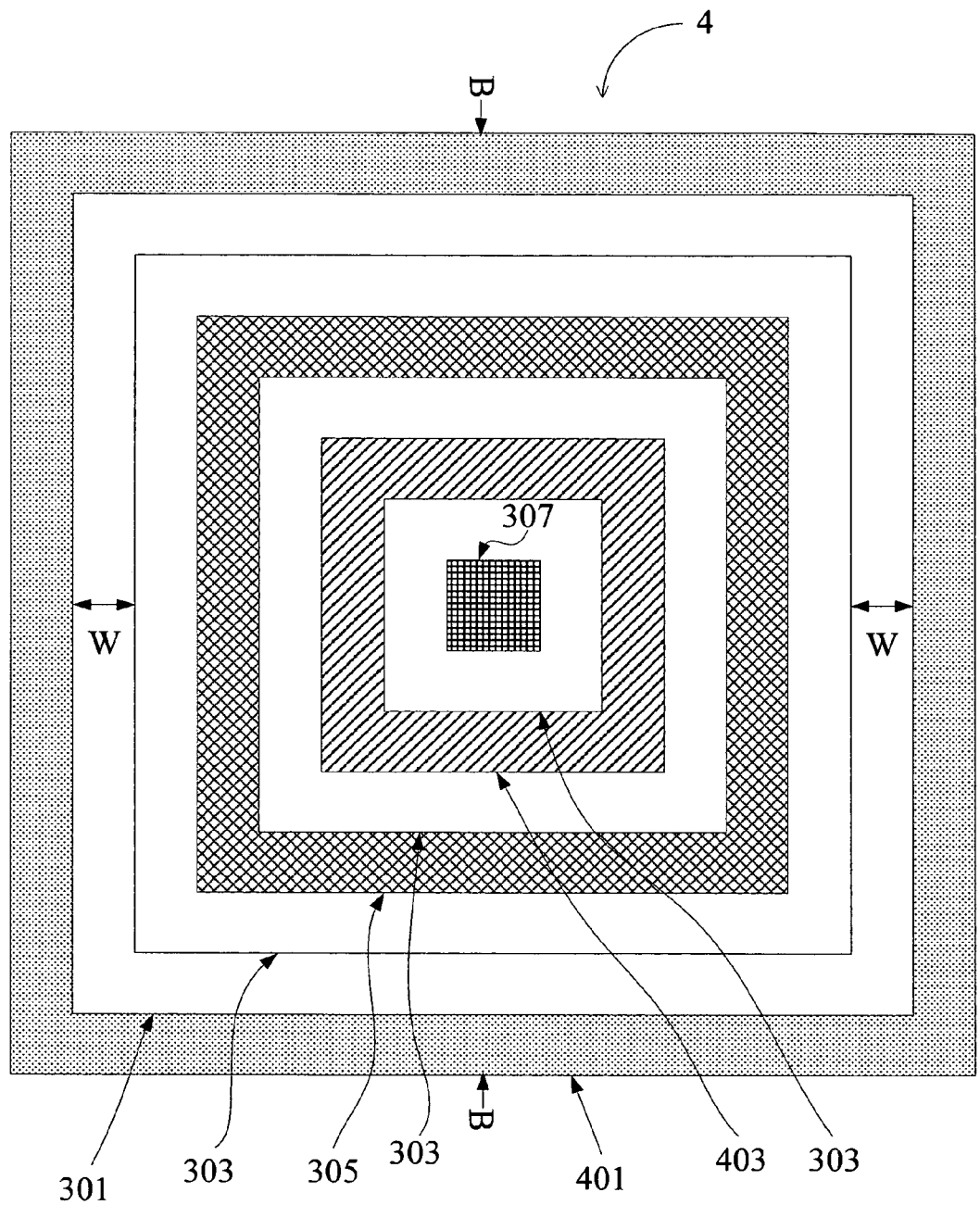
FIG. 4 illustrates a top view of a second embodiment of the present invention.
Figure 5:
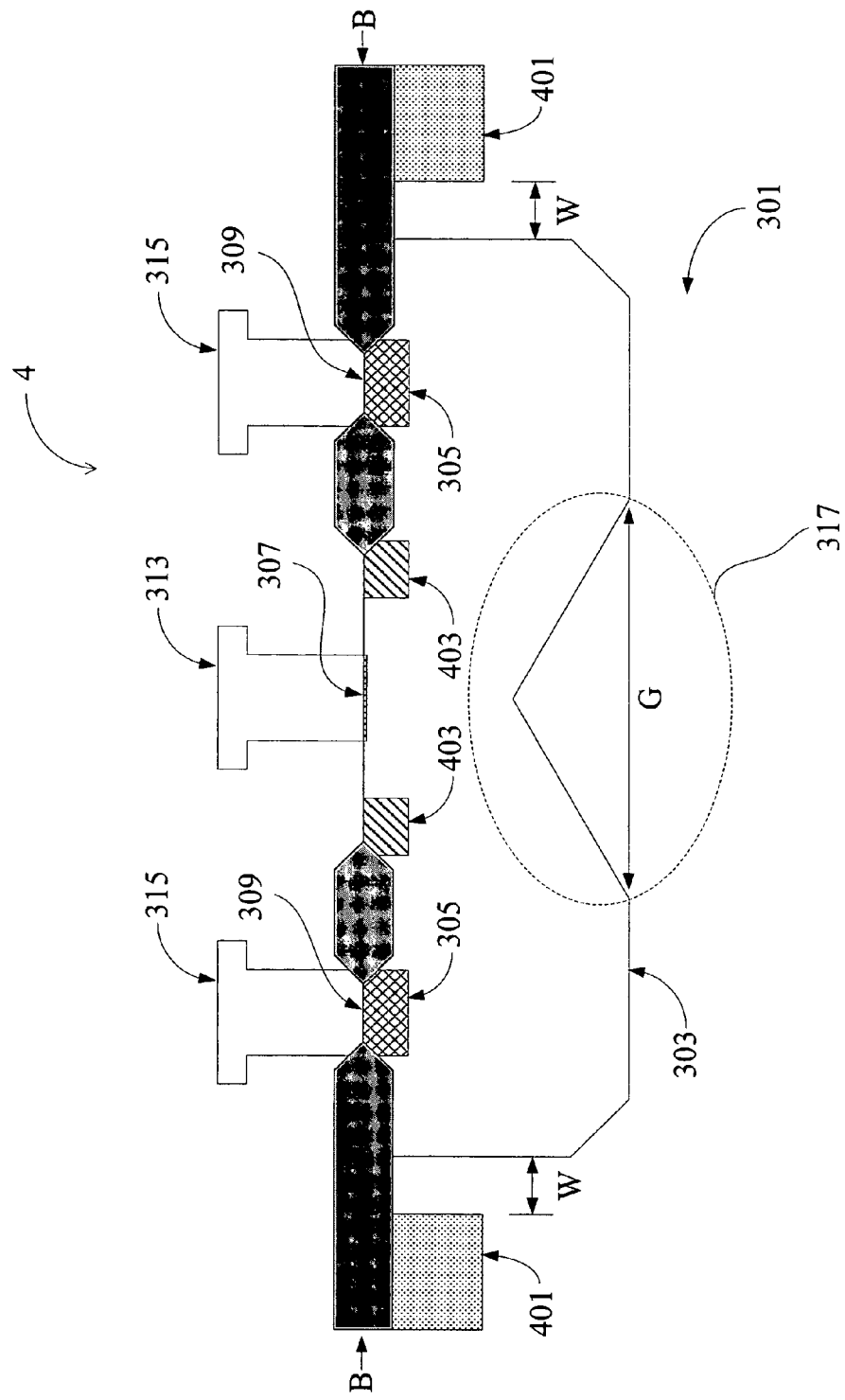
FIG. 5 illustrates a cross-section view of the second embodiment of the present invention.

A second embodiment of the present invention is another Schottky device 4 as illustrated in FIG. 4 and FIG. 5. FIG. 4 is a top view of the Schottky device 4, and FIG. 5 is a side elevational, cross-sectional view of the portion of the Schottky device 4 of FIG. 4 taken substantially along section line B-B thereof. The Schottky device 4 is similar to the Schottky device 3 of the first embodiment. The Schottky device 4 comprises a first doped region 401 in the second embodiment, and further comprises a second doped region 403. The first doped region 401 is doped with the p-type of ions in the P-substrate 301, and separated from the deep N-well 303 by a distance W. The second doped region 403 is doped with the p-type of ions and formed in the deep N-well 303.

The distance W between the deep N-well 303 and the first doped region 401 can be configured to adjust a breakdown voltage of the Schottky device 4. When the distance W increases, the breakdown voltage also increases. The breakdown voltage stops increasing until the distance W exceeds a predetermined value. In addition, the breakdown voltage can be respectively adjusted by at least one of an ion concentration, a square measure, and a depth of the second doped region 403.

According to the above description, parameters of the Schottky device 4 comprise a range of the ion concentration of the deep N-well 303 from 1E12 to 5E13 per square centimeter, a range of a depth of the deep N-well 303 from 2 to 10 um, a range of the ion concentration of the first doped region 401 from 1E12 to 5E13 per square centimeter, a range of the ion concentration of the second doped region 403 from 1E15 to 5E16 per square centimeter, a range of an ion concentration of the heavily doped region 305 from 1E15 to 5E16 per square centimeter, a range of a depth of the first doped region 401 from 1 to 5 μm, a range of the width G is from 0 to 10 μm, and a range of the distance W from 0 to 20 μm.

The n-type doped regions and p-type doped regions of the first and second embodiments are denoted for illustration. Those skilled in the art can easily understand that the n-type of ions and the p-type of ions are configured to be complementary in the first and second embodiments. The p-type of ions can be replaced by the n-type of ions, and the n-type of ions can be replaced correspondingly by the p-type of ions.

Figure 6:
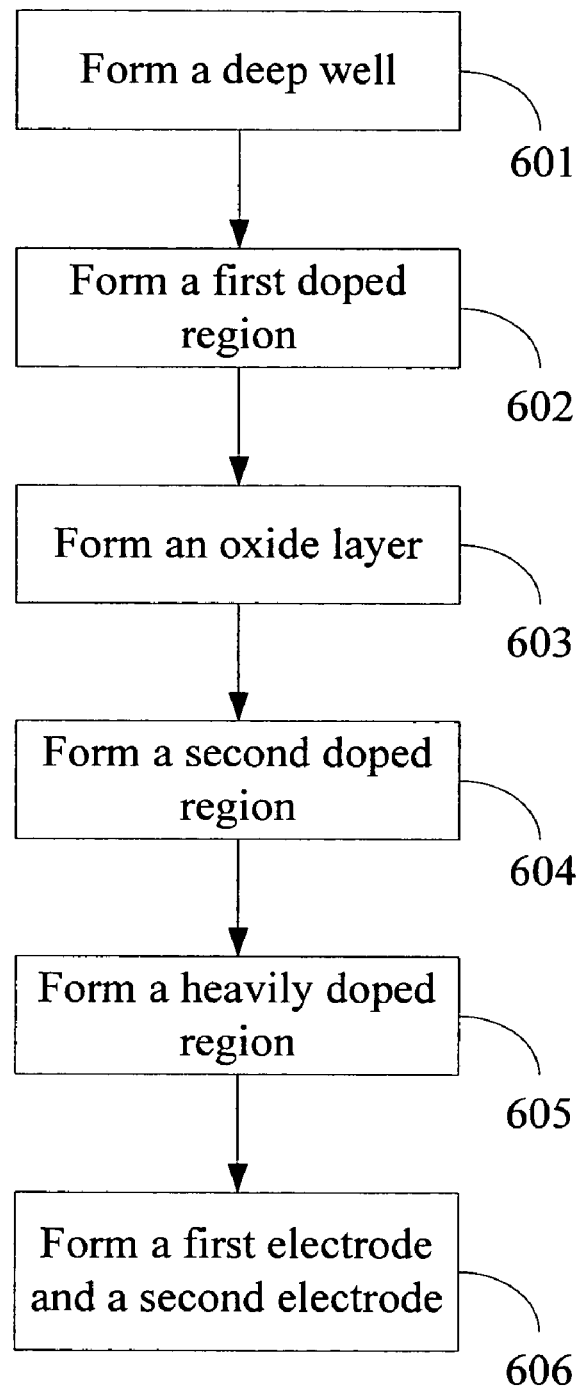
FIG. 6 illustrates a flow chart of a third embodiment of the present invention.

A third embodiment of the present invention is a semiconductor process for forming a Schottky device as illustrated in FIG. 6. Each region in the following steps can be understood as the same region described with the same name in the first and second embodiments. Step 601 is executed to form a deep well with a second type of ions in a substrate, and the substrate containing a first type of ions. Step 602 is executed to form a first doped region with the first type of ions. The step 601, 602 can be achieved by thermal driving for 6 to 12 hours under 1000 to 1200 degrees of Celsius. Step 603 is executed to form an oxide layer. Step 604 is executed to form a second doped region in the deep well with the first type of ions. Step 605 is executed to form a heavily doped region in the deep well with the second type of ions. Finally, step 606 is executed to form a first electrode on a Schottky contact on the deep well, and a second electrode on an Ohmic contact on the heavily doped region.

Wherein the first type of ions and the second type of ions are complementary, the second doped region is around the first electrode, the deep well has a geometry gap with a width formed under the Schottky contact, and the first doped region and the deep well are separated by a distance. Alternatively, the first doped region may be formed before the deep well being formed. That is, step 601 can be executed posterior to step 602. Moreover, the sequence of the aforementioned steps is for the purpose of an example. The sequence is not intended to be a limitation of the present invention.

Accordingly, the present invention is capable to provide a Schottky device with a high breakdown voltage. The corresponding semiconductor processes are also provided. First, a deep N-well of the Schottky device contains a geometry gap with a width. Second, a doped region being doped the p-type of ions is around the Schottky contact of the Schottky device. Finally, another doped region being doped the p-type of ions of the Schottky device is separated from the deep N-well of the same by a distance. The above conditions can be configured to adjust the breakdown voltage of the Schottky device. Therefore, the present invention can achieve the goal without extra masks and processes.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A Schottky device with a breakdown voltage, comprising:
    a substrate being doped with a first type of ions;
    a deep well being doped with a second type of ions, and formed in the substrate;
    a Schottky contact, at a top surface of the deep well, contacting a first electrode with the deep well;
    two heavily doped regions being doped with the second type of ions in the deep well;
    two Ohmic contacts contacting two second electrodes with the two heavily doped regions, respectively;
    two first doped regions being doped with the first type of ions in the substrate, wherein each of the two first doped regions is separated from the deep well by a distance which is larger than 0 μm and equal to or smaller than 20 μm, and the distance between the deep well and each of the first doped regions adjusts the breakdown voltage; and
    two second doped regions being doped with the first type of ions, and being only formed in the deep well and around the Schottky contact, wherein an ion concentration and a depth of the two second doped regions respectively adjust the breakdown voltage;
    wherein the deep well has a geometry gap with a width, the geometry gap is formed at a bottom surface of the deep well and opposite the Schottky contact, and has a tapered shape having two side surfaces of a triangle in a cross-sectional view, the first type of ions and the second type of ions are complementary, and the width of the gap is configured to adjust the breakdown voltage.

2. The Schottky device as claimed in claim 1, wherein a range of a depth of the deep well is from 2 to 10 μm.

3. The Schottky device as claimed in claim 1, wherein a range of an ion concentration of the deep well is from 1E12 to 5E13 per square centimeter.

4. The Schottky device as claimed in claim 1, wherein a range of an ion concentration of each of the two first doped regions is from 1E12 to 5E13 per square centimeter.

5. The Schottky device as claimed in claim 1, wherein a range of a depth of each of the two first doped regions is from 1 to 5 μm.

6. The Schottky device as claimed in claim 1, wherein the geometry gap is spaced in from one side of the deep well doped with the second type of ions leaving portions of the deep well doped with the second type of ions located outside the width of the geometry gap.

7. A semiconductor process for forming a Schottky device, comprising the steps of:
    forming a deep well with a second type of ions in a substrate being doped with a first type of ions;
    forming two first doped regions with the first type of ions;
    forming an oxide layer;

forming two second doped regions only in the deep well with the first type of ions;

forming two heavily doped regions being doped with the second type of ions in the deep well; and forming a first electrode on a Schottky contact at a top surface of the deep well and two second electrodes on two Ohmic contacts on the two heavily doped regions, respectively;

wherein each of the two first doped regions are separated from the deep well by a distance which is larger than 0 μm and equal to or smaller than 20 μm, the first type of ions and the second type of ions are complementary, the second doped regions are around the first electrode, and the deep well has a geometry gap with a width, the geometry gap is formed at a bottom surface of the deep well and opposite the Schottky contact, and has a tapered shape having two side surfaces of a triangle in a cross-sectional view, and the width of the gap is configured to adjust the breakdown voltage.

8. The semiconductor process of claim 7, wherein the step of forming the deep well further comprises the step of:

thermal driving for 6 to 12 hours under 1000 to 1200 degrees of Celsius.

9. The semiconductor process of claim 7, wherein the step of forming the two first doped regions further comprises the step of:

thermal driving for 6 to 12 hours under 1000 to 1200 degrees of Celsius.

10. The semiconductor process of claim 7, wherein the deep well formed under the Schottky contact is formed to be spaced in from one side of the deep well doped with the second type of ions leaving portions of the deep well doped with the second type of ions located outside the width of the geometry gap.

* * * * *